US012603205B2

(12) United States Patent
Forthmann et al.

(10) Patent No.: US 12,603,205 B2
(45) Date of Patent: Apr. 14, 2026

(54) SYSTEM FOR CONTROLLING A SUPERCONDUCTING COIL WITH A MAGNETIC PERSISTENT CURRENT SWITCH

(71) Applicant: KONINKLIJKE PHILIPS N.V., Eindhoven (NL)

(72) Inventors: Peter Forthmann, Sandesneben (DE); Philippe Abel Menteur, Niskayuna, NY (US)

(73) Assignee: Koninklijke Philips N.V., Eindhoven (NL)

( * ) Notice: Subject to any disclaimer, the term of this patent is extended or adjusted under 35 U.S.C. 154(b) by 116 days.

(21) Appl. No.: 18/568,402

(22) PCT Filed: Jun. 2, 2022

(86) PCT No.: PCT/EP2022/065114
§ 371 (c)(1),
(2) Date: Dec. 8, 2023

(87) PCT Pub. No.: WO2022/258493
PCT Pub. Date: Dec. 15, 2022

(65) Prior Publication Data
US 2024/0290525 A1 Aug. 29, 2024

(30) Foreign Application Priority Data

Jun. 11, 2021 (EP) ..................................... 21178965

(51) Int. Cl.
*H01F 6/06* (2006.01)
*F16K 31/08* (2006.01)
(Continued)

(52) U.S. Cl.
CPC ............. *H01F 6/06* (2013.01); *F16K 31/082* (2013.01); *G01R 33/3804* (2013.01); *G01R 33/3815* (2013.01); *H01F 6/04* (2013.01)

(58) Field of Classification Search
CPC ............. F16K 31/082; G01R 33/3804; G01R 33/3815; H01F 6/04; H01F 6/06;
(Continued)

(56) References Cited

U.S. PATENT DOCUMENTS 6,040,752 A * 3/2000 Fisher ................... H01F 7/1615
335/229
6,129,115 A 10/2000 Janssen et al.
(Continued)

FOREIGN PATENT DOCUMENTS

CA 2435356 A1 1/2001
CN 202418829 U 9/2012
(Continued)

OTHER PUBLICATIONS

International Search Report and Written Opinion from PCT/EP2022/065114 mailed Sep. 27, 2022.

*Primary Examiner* — Kevin J Comber

(57) ABSTRACT

The invention relates to a system for controlling a superconducting coil (6) with a magnetic persistent current switch (7). The magnetic persistent current switch (7) is used for switching the superconducting coil (6) between a persistent mode and a ramp mode, respectively. The system further comprises a heat exchanger (10) configured to disperse heat to a cryocooler (3), a loop tube (13) configured to enable flow of coolant to transfer thermal energy generated by the magnetic persistent current switch (7) to the heat exchanger (10), and a thermal switch (9) comprising a valve (14) integrated with the loop tube (13) between the magnetic
(Continued)

persistent current switch (7) and the heat exchanger (10), the valve (14) comprising a valve body (15) with and inlet (16) and an outlet (17) with which the valve body (15) is connected to the loop tube (13), a movable shaft (18) which is arranged inside the valve body (15) and which comprises a permanent rod magnet (19), a latching arrangement (20) which comprises a permanent magnet (21), and a solenoid (22), wherein the shaft (18) is movable between a closed position in which the shaft (18) effects the closing of the inlet (16) or the outlet (17) of the valve body (15) and therefore no flow of coolant through the valve body is allowed, and an open position in which the inlet (16) and the outlet (17) of the valve body (15) are open and therefore flow of coolant through the valve body (15) is allowed, the solenoid (22) is arranged relative to the shaft (18) in such a way that by applying a current pulse with a first polarity to the solenoid (22) the shaft (18) is moved to the closed position, and by applying a current pulse with a second polarity to the solenoid (22), the second polarity being opposite to the first polarity, the shaft (18) is moved to the open position, and the latching arrangement (20) is arranged relative to the shaft (18) in such a way that the magnetic force acting from the permanent magnet (21) of the latching arrangement (20) to the permanent magnet (19) of the shaft (18) forces the shaft (18) to stay in the closed position or in the open position, respectively, as long as no current pulse is applied to the solenoid (22) for switching the shaft (18) from the closed position to the open position or vice versa, respectively. In this way, a cooling system is provided that allows the temperature of the magnet persistent current switch (7) to rise and fall as desired within a short period of time, without straining the cooling system for the superconducting coil (7).

10 Claims, 6 Drawing Sheets

(51) Int. Cl.
| | | |
|---|---|---|
| *G01R 33/38* | (2006.01) | |
| *G01R 33/3815* | (2006.01) | |
| *H01F 6/04* | (2006.01) | |

(58) Field of Classification Search
CPC .......... H01F 7/122; H01F 7/14; H01F 7/1646; H01F 2007/086; H01F 2007/1669
USPC ........................................................ 361/141
See application file for complete search history.

(56) References Cited

U.S. PATENT DOCUMENTS

| | | | | |
|---|---|---|---|---|
| 2002/0158727 | A1 | 10/2002 | Namen | |
| 2006/0023390 | A1* | 2/2006 | Spurr ..................... | H01H 51/22 |
| | | | | 361/160 |

FOREIGN PATENT DOCUMENTS

| | | | | |
|---|---|---|---|---|
| CN | 104500766 A | 4/2015 | | |
| DE | 2923403 A1 | 12/1980 | | |
| DE | 275509 A1 | 1/1990 | | |
| DE | 19945262 A1 | 4/2001 | | |
| JP | 02236078 A | 9/1990 | | |
| JP | 7158764 A | 6/1995 | | |
| WO | 2008011886 A1 | 1/2008 | | |
| WO | WO-2020193415 A1* | 10/2020 | .......... | F16K 31/062 |

* cited by examiner

SYSTEM FOR CONTROLLING A SUPERCONDUCTING COIL WITH A MAGNETIC PERSISTENT CURRENT SWITCH

CROSS REFERENCE TO RELATED APPLICATIONS

This application is a U.S. national phase application of International Application No. PCT/EP2022/065114 filed Jun. 2, 2022, which claims the benefit of EP application Ser. No. 21/178,965.6 filed on Jun. 11, 2021 and is incorporated herein by reference.

FIELD OF THE INVENTION

The invention relates to the field of superconducting coils and in particular to a magnetic persistent current switch for switching a superconducting coil between a persistent mode and a ramp mode, respectively.

BACKGROUND OF THE INVENTION

Superconducting magnets may be used in systems that require strong magnetic fields, such as magnetic resonance imaging (MRI) and nuclear magnetic resonance (NMR) spectrometry, for example. To realize superconductivity, a magnet includes one or more electrically conductive coils which are formed from superconducting wire. In order to maintain superconductivity, a cryogenic environment at a temperature near absolute zero during operation is necessary. In the superconducting state, the electrically conductive coils are referred to as superconducting coils, which effectively have no electrical resistance, and therefore conduct much larger electric currents to create strong magnetic fields.

Operation of a superconducting magnet in the superconducting state may be referred to as persistent current mode. That is, the persistent current mode is the state in which an electrical circuit (e.g., including superconducting coils) can carry electrical current substantially indefinitely and without the need for an external power source due to the absence of electrical resistance. To operate in the persistent current mode, the superconducting magnet provides a closed superconducting circuit with a superconducting loop. This circuit is interrupted to allow a power source to drive electrical current into the coils. Interrupting the circuit typically includes warming up a section of the superconducting loop, so that the superconducting loop develops an electrical resistance. The component of the superconducting circuit responsible for switching between the superconducting state and normal (non-superconducting) resistance is called a magnet persistent current switch (MPCS). The superconducting state is also called persistent state, and the normal state is called ramp state, i.e. a state for ramping up or ramping down the superconducting coil.

When a voltage source is connected across the MPCS, most of the current will flow into the coils, and only a small current will flow through the now resistive wires of the MPCS. Both the action of opening the MPCS and applying voltage across it cause the MPCS to generate heat. A low temperature cooling system, also called cryostat, which also cools the superconducting coils, usually cannot cope with the additional heat generated by the MPCS when the cooling system has a limited capacity to absorb or take away that heat. This is the case in so-called cryogen free, or sealed systems, which require that the MPCS be thermally disconnected from the cooling system while the magnet is energized or de-energized.

In this respect, the international application WO 2020/193415 A1 describes a system for controlling the temperature of a persistent current switch operating in a background magnetic field which includes a heat exchanger, a loop tube, a ball valve and multiple electromagnets. The heat exchanger disperses heat to a cryocooler. The loop tube enables flow of coolant to transfer thermal energy generated by the persistent current switch to the heat exchanger. The ball valve is integrated with the loop tube between the persistent current switch and the heat exchanger, and contains a ferromagnetic ball. The electromagnets are positioned outside the loop tube adjacent to the ball valve, where energizing a first electromagnet of the multiple electromagnets magnetically moves the ferromagnetic ball to a first position opening the loop tube and enabling the flow of the coolant, and energizing a second electromagnets magnetically moves the ferromagnetic ball to a second position closing the loop tube and blocking the flow of the coolant.

SUMMARY OF THE INVENTION

It is an object of the invention to provide a cooling system that allows the temperature of a magnet persistent current switch to rise and fall as desired within a short period of time, without straining the cooling system for the superconducting coil.

According to the invention, this object is addressed by the subject matter of the independent claims. Preferred embodiments of the invention are described in the dependent claims.

Therefore, according to the invention, a system for controlling a superconducting coil is provided which comprises
   a magnetic persistent current switch for switching the superconducting coil between a persistent mode and a ramp mode, respectively,
   a heat exchanger configured to disperse heat to a cryocooler,
   a loop tube configured to enable flow of coolant to transfer thermal energy generated by the magnetic persistent current switch to the heat exchanger, and
   a thermal switch comprising a valve integrated with the loop tube between the magnetic persistent current switch and the heat exchanger, the valve comprising
   a valve body with and inlet and an outlet with which the valve body is connected to the loop tube,
   a movable shaft which is arranged inside the valve body and which comprises a permanent rod magnet,
   a latching arrangement which comprises a permanent magnet or a ferrous of paramagnetic holding element, and
   a solenoid, wherein
   the shaft is movable between a closed position in which the shaft effects the closing of the inlet or the outlet of the valve body and therefore no flow of coolant through the valve body is allowed, and an open position in which the inlet and the outlet of the valve body are open and therefore flow of coolant through the valve body is allowed,
   the solenoid is arranged relative to the shaft in such a way that by applying a current pulse with a first polarity to the solenoid the shaft is moved to the closed position, and by applying a current pulse with a second polarity to the solenoid, the second polarity being opposite to the first polarity, the shaft is moved to the open position, and the latching arrangement is arranged relative to the shaft in such a way that the magnetic force acting from the permanent magnet of the latching arrangement to the permanent magnet of the shaft forces the shaft to stay in the closed position or in the open position, respectively, as long as no current pulse is applied to the solenoid for switching the shaft from the closed position to the open position or vice versa, respectively. Alternatively, the latching arrangement is provided with the ferrous or paramagnetic holding element that is magnetized by the permanent rod magnet of the shaft being in the vicinity of the holding element. The holding clement may be formed as a ferrous or paramagnetic insert. The magnetic force between the permanent rod magnet cand the induced magnetisation of the holding element will keep the movable shaft in its current stable (open or closed) position when the solenoid is not activated.

The present invention concerns a system for controlling a superconducting coil with a magnetic persistent current switch for ramping (up/down) of the superconducting coil and for operating the superconducting coil in a persistent mode. In order to carry-off heat from the magnetic persistent current switch during ramping of the superconducting coil, a loop tube in which a coolant flows is provided between the magnetic persistent current switch an a heat exchanger. This cooling circuit is controlled by way of a valve with permanent magnetic movable shaft that is moved by way of solenoid electromagnet coil.

According to one aspect of the invention the shaft is latched in its current position by way of a latching arrangement with a permanent magnet or a ferrous or paramagnetic holding element. The latching arrangement forces the shaft to stay in a stable resting position formed by the closed position or in the open position, respectively, as long as no current pulse is applied to the solenoid. Thus, when an electrical current pulse of appropriate polarity is applied to the solenoid, the magnetic field of the solenoid moves the permanent magnetic shaft into its current position. Subsequent to the electrical current pulse, the latching arrangement maintains the shaft in its current position without the need to continue to activate the solenoid. Thus, the invention achieves to move the shaft between the open and closed positions of the valve by the magnetic field of the solenoid and without the need of mechanical contact to the shaft. The shaft is maintained in its current position (i.e. the latest position it was moved into) by the latching arrangement without the need to apply power to the latching arrangement. Thus, the operation of the valve only requires power when the valve is switched between its open and closed positions and no power is required to keep the shaft in its current stable resting position.

Due to the push/pull capability of the solenoid in conjunction with the permanent magnet, the valve can be operated with just one pulsed solenoid. It is largely gravity independent, as the stable resting positions (open or closed position) are maintained by the latching force provided by the magnets of the latching arrangement.

With respect to the solenoid, it is essential for the invention that the solenoid is arranged relative to the shaft in such a way that by applying a current pulse with a first polarity to the solenoid the shaft is moved to the closed position, and by applying a current pulse with a second polarity to the solenoid, the second polarity being opposite to the first polarity, the shaft is moved to the open position. For that, the design, orientation and location of the solenoid may be different for different designs of the system for controlling the superconducting coil. For example, the solenoid may be arranged laterally next to the valve body or, in the alternative, the solenoid may be wrapped around the valve body. Further, other designs and arrangements are possible. Furthermore, interference with an existing magnetic background field may have to be taken into account. Such an existing magnetic background field may exert a force or torque on the solenoid when powered, which may be undesirable and should be compensated, e.g. by a different orientation of the solenoid.

According to a preferred embodiment of the invention, the shaft in one of its two end regions comprises a scaling element which effects the scaling of the inlet or the outlet in the closed position by pressing against a valve seat arranged at the inlet or the outlet, respectively.

In general, the shaft may be movable within the valve body in different ways. According to a first preferred embodiment of the invention, the shaft is arranged within the valve body in such a way that it is rotatable along a rotation axis which is perpendicular to the longitudinal axis of the shaft.

As always, the longitudinal axis is to be understood to be the axis of the shaft of longest elongation. For this first preferred embodiment of the invention, the sealing element preferably is a scaling ball within an inner bore with which it is movably arranged on the shaft. In this respect, it is preferred that the valve body comprises a groove for guiding the sealing bore ball during the rotation of the shaft. While, in general, the other end of the shaft could be a free end, preferably, the shaft comprises a balancing ball on the other end region, the balancing ball having an inner bore with which it is also movably arranged on the shaft. Further, in this respect, the valve body preferably comprises a groove for guiding the balancing bore ball during the rotation of the shaft. In this way, a stable design is achieved which allows for reliably switching from an open to a closed state of the valve and vice versa.

In general, according to the first embodiment of the invention where the shaft is rotatable, the rotation range of the shaft is not limited to a certain value. However, according to a preferred embodiment of the invention, the rotation range of the shaft is limited to less than 90°, the permanent magnet of the latching arrangement is a permanent rod magnet, and the permanent magnet of the latching arrangement is arranged such that one of its ends is directed to the middle region of the rotation range, the polarity of this end being the same as the polarity of the shaft's permanent rod magnet in this rotation range. This provides for the following operation: The shaft, due to repulsive magnetic forces between the same polarities, is cither forced in the position which relates to the open state or in the position which relates to the closed state. Further, a switching from the open state to the closed state or vice versa may only be achieved by applying a current pulse with a respective polarity to the solenoid in order to effect a respective pulling or repulsive magnetic force to the shaft, respectively. In this respect, according to a preferred embodiment, the permanent magnet of the latching arrangement is fixed and only serves for the purpose of maintaining the open state or the closed state, respectively, as long as no current is applied to the solenoid. In contrast to that, according to another embodiment, the permanent magnet of the latching arrangement is pivotally fixed to the valve body. Here, the permanent magnet of the latching arrangement is pivotally arranged inside the valve body in such a way that its end which is directed to the rotation range is pivoted away from the closing position when the shaft is moved to the closing position and pivoted from away from the open position when the shaft is moved to the open position. In this respect, according to a preferred embodiment of the invention, two switching contacts are provided in such a way that one of these switching contacts is activated by the permanent rod magnet of the latching arrangement by pivoting away from the closed state in order to indicate the closed state of the valve, and the other one is activated by the permanent rod magnet of the latching arrangement by pivoting away from the open state in order to indicate the open state of the valve.

According to a second preferred embodiment of the invention, the shaft is not rotatable but is arranged within the valve body in such a way that it is linearly movable along a shaft channel which is provided in the valve body. In this respect, it is preferred that, instead of using a separate scaling element, the shaft itself may affect the sealing of the inlet or the outlet in the closed position by pressing against a valve scat arranged at the inlet or the outlet. Further, for the second preferred embodiment of the invention, it is further preferred that the valve body comprises a flow channel which runs parallel to the shaft channel from the inlet to the outlet, wherein the shaft is arranged in such a way inside the valve body that the flow channel is open in the open position for allowing the coolant to flow through the valve body from the inlet to the outlet. Also for the second preferred embodiment of the invention, it is preferred to have a latching arrangement. In this respect, a first permanent magnet is arranged at one end region of the shaft channel and a second permanent magnet is arranged at the other end region of the shaft channel, wherein the polarity of the first permanent magnet and the polarity of the end of the permanent rod magnet of the shaft which is facing to the first permanent magnet are opposite to each other, and wherein the polarity of the second permanent magnet and the polarity of the end of the permanent rod magnet of the shaft which is facing to the second permanent magnet are opposite to each other. Also this latching arrangement allows for reliably maintaining the open or closed state of the valve, respectively, as long as no current pulse is provided to the solenoid.

The invention also relates to a method for operating a system for controlling a superconducting coil, the system comprising a magnetic persistent current switch, a heat exchanger configured to disperse heat to a cryocooler, a loop tube connecting the magnetic persistent current switch to the heat exchanger, and a thermal switch comprising a valve integrated with the loop tube between the magnetic persistent current switch and the heat exchanger, the valve comprising a valve body with and inlet and an outlet with which the valve body is connected to the loop tube, a movable shaft which is arranged inside the valve body and which comprises a permanent rod magnet, a latching arrangement which comprises a permanent magnet, and a solenoid, wherein the method comprises the following method steps:

switching the superconducting coil between a persistent mode and a ramp mode, respectively, dispersing heat from the heat exchanger to the cryocooler, enabling flow of coolant to transfer thermal energy generated by the magnetic persistent current switch to the heat exchanger, moving the shaft between a closed position in which the shaft effects the closing of the inlet or the outlet of the valve body and therefore no flow of coolant through the valve body is allowed, and an open position in which the inlet and the outlet of the valve body are open and therefore flow of coolant through the valve body is allowed, applying a current pulse with a first polarity to the solenoid such that the shaft is moved to the closed position, or applying a current pulse with a second polarity to the solenoid, the second polarity being opposite to the first polarity, so that the shaft is moved to the open position, and letting the magnetic force from the permanent magnet of the latching arrangement act to the permanent magnet of the shaft to force the shaft to stay in the closed position or in the open position, respectively, as long as no current pulse is applied to the solenoid for switching the shaft from the closed position to the open position or vice versa, respectively.

Further, the invention also relates to a non-transitory computer-readable medium, comprising instructions stored thereon, that when executed on a processor induce a system for controlling a superconducting coil as described above to perform the method as described before.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
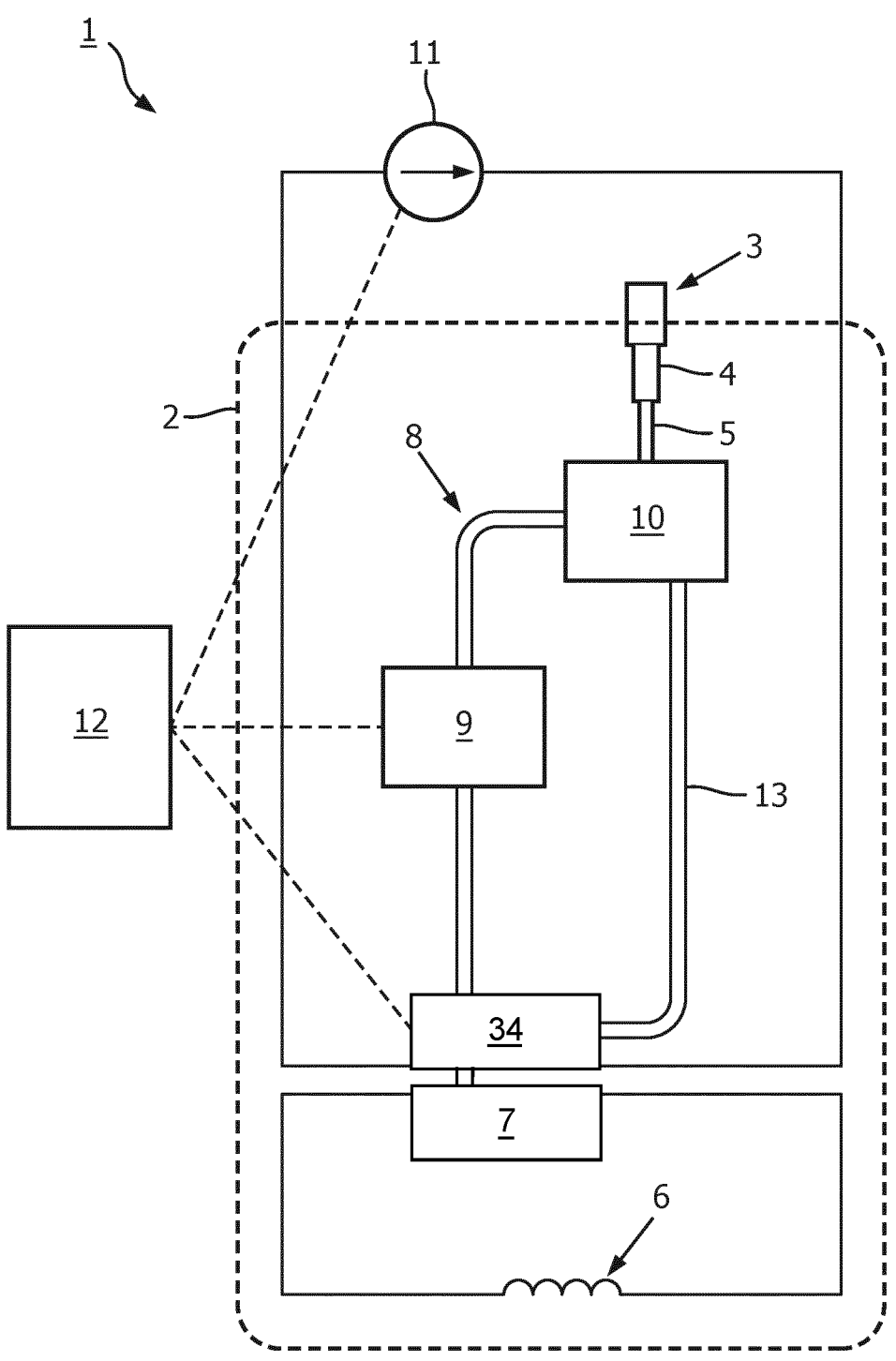
FIG. 1 schematically depicts a schematic block diagram of a superconducting magnet system according to a preferred embodiment of the invention, FIG. 2 schematically depicts a valve of a superconducting magnet system according to a preferred embodiment of the invention in an open position, FIG. 3 schematically depicts the valve of a superconducting magnet system according to the preferred embodiment of the invention of FIG. 3 in a closed position, FIG. 4 schematically depicts a valve of a superconducting magnet system according to another preferred embodiment of the invention in an open position, FIG. 5 schematically depicts the valve of a superconducting magnet system according to the preferred embodiment of the invention of FIG. 4 in a closed position, FIG. 6 schematically depicts a valve of a superconducting magnet system according to still another preferred embodiment of the invention in an open position, FIG. 7 schematically depicts the valve of a superconducting magnet system according to the preferred embodiment of the invention of FIG. 6 in a closed position.

FIG. 1 depicts a schematic block diagram of a superconducting magnet system according to a preferred embodiment of the invention. According to this preferred embodiment, a superconducting magnet system 1 includes a superconducting coil 6 of a superconducting magnet connected in parallel with a magnet persistent current switch (MPCS) 7 and a power supply 11 which is shown as a current source, for purposes of illustration. The superconducting coil 6 is in a cryostat 2 of the superconducting magnet system 1 in order to limit heat input to the superconducting coil 6. The superconducting coil 6 may be maintained at low temperature by a cryocooler 3 in and attached to the cryostat 2, where the cryocooler 3 has a first stage 4 that maintains the temperature of a thermal shield (not shown in FIG. 1) that envelops the superconducting coil 6 at about 40 Kelvin, and a second stage 5, that maintains the temperature of the superconducting coil 6 at about 4 Kelvin. A portion of the cryocooler 3 is accessible from outside the cryostat 2. A heat exchanger 10 of a convective cooling loop 8 is permanently connected to, or in thermal contact with, the second stage 5 of the cryocooler 3. A power supply 11 may be permanently or temporarily connected to electrical contacts outside the cryostat 2.

A controller 12 may be implemented by a computer system or computer device, for example, with one or more processors executing instructions, e.g., stored in memory and/or on a computer readable medium, as discussed above. In the depicted embodiment, the controller 12 controls the power supply 11 and the state of the MPCS 7, indicated by dashed lines, to enable ramping up the magnet, putting the magnet in persistent current mode, and ramping down the magnet, e.g., in response to instructions given by an operator. The controller 12 also controls operation of a thermal switch 9, indicated by a dashed line, in the convective cooling loop 8 to control the temperature of the MPCS 7 by selectively blocking and enabling flow of coolant through a loop tube 13 in the convective cooling loop 8. The MPCS 7 is thermally coupled to the loop tube 13 via a second heat exchanger 34. It is understood that the controller 12 includes one or more processors, as well as other components of a computer system, as described above. The instructions, stored in in memory and/or on a computer readable medium, and executed by the processor(s) include instructions for opening and closing the MPCS 7, opening and closing the thermal switch 9, and changing the voltage/power output by the power supply 11.

More particularly, the controller 12 controls the MPCS 7 to selectively enter a closed state, i.e. the superconducting state, and an open state. i.e. the normal or non-superconducting state. The MPCS 7 includes composite superconducting wire made of superconducting filaments inside a copper matrix, similar to the superconducting wire used in the superconducting coil 6. Like other superconducting wires, this composite superconducting wire acts as a normal conductor at higher temperatures and as superconductor at cryogenic temperatures. When the MPCS 7 is in a closed (superconducting) state, it is able to carry the main magnet current, and the superconducting magnet is able to enter the persistent current mode. The MPCS 7 may be switched to the closed state by cooling, e.g., using the cryocooler 3. When the MPCS 7 is in an open (non-superconducting or normal) state, it cannot carry the main magnet current. The MPCS 7 may be switched to the closed state by heating, e.g., using a MPCS heater (not shown). However, the MPCS 7 has a small (normal) resistance in the open state, which is high enough that, when the magnet is connected to the power supply 11, only a small amount of current flows through the MPCS 7 and the rest of the current flows in the superconducting coil 6. Accordingly, when the MPCS 7 is open, the magnet may be in a ramping state, during which the MPCS 7 dissipates power because the ramping voltage across the MPCS 7 generates current flowing through its normal resistivity. When the MPCS 7 is closing, there is no ramping voltage present and no power dissipation. The MPCS 7 transitions from the open state to the closed state by means of cooling, via the convective cooling loop 8 discussed below, and the power supply 11 maintains magnet operating current during the transition. When the MPCS 7 is in the fully closed state (as opposed to transitioning between open and closed), the power supply 11 ramps down the current. The high self-inductance of the superconducting coil 6 ensures that the coil current does not change, so as a result, current through the MPCS 7 ramps up as the power supply 11 current ramps down.

In addition, the controller 12 controls the thermal switch 9 in the convective cooling loop 8 to open and close depending on the action required by the operator. For example, when the MPCS 7 is in the open state while the magnet needs to be put into persistent current mode after a ramping activity, the thermal switch 9 is opened to enable the flow of coolant through the convective cooling loop 8, thereby thermally connecting the MPCS 7 to heat exchanger 10 via the loop tube 13 to provide additional cooling for closing the MPCS 7. When the MPCS 7 is in the closed state, but needs to be opened, for instance to ramp the magnet up or down. the thermal switch 9 is closed to stop the flow of coolant through the convective cooling loop 8, e.g., by blocking the loop tube 10 as discussed below, thereby thermally disconnecting the MPCS 7 from heat exchanger 10, and allowing it to heat up to open without overloading the second stage 5 of the cryocooler 3. When the magnet is in the ramping state, and the MPCS 7 is in the open state, the thermal switch 9 is in closed state to ensure that power generated by the MPCS 7 does not overload the second stage 5 of the cryocooler 3 (which keeps the superconducting coil 6 cold). When the magnet enters the persistent current state, the thermal switch 9 is opened to keep the MPCS 7 thermally connected to the heat exchanger 10, ensuring that the MPCS 7 stays in superconducting state.

The second stage 5 of the cryocooler 3 is able to bring the superconducting coil 6 of the magnet system to the desired cryogenic temperature of about 4 Kelvin, although it has a limited capacity for absorbing power. Thus, heat coming from the MPCS 7 in the open state would otherwise overload the cryocooler 3. As discussed above, when the power supply 11 is connected across the MPCS 7 in its open state, most of the current will flow into the superconducting coil 6, and only a small current will flow through the normal, resistive wires of the MPCS 7. Once current flowing through the superconducting coil 6 has reached its target value (target current), the controller 12 controls the MPCS 7 to enter the closed state, enabling the superconducting coil 6 to operate in a persistent current mode with effectively zero resistance, after ramping down the power supply 11. This may be referred to as a closed superconducting circuit. The target current is the current needed to flow in the wire to make the target field at the center of the superconducting magnet.

In general, the magnet MPCS 7 generates heat, i.e. thermal energy, when in the open state due to current flow through the normal resistance, and also may continue to generate heat when controlled to transition from the closed state to the open state or vice versa. When the current in the superconducting coil 6 has reached the target current, the controller 12 turns off the voltage of the power supply 11, but the high inductance of the superconducting coil 6 causes the current to continue to flow through the power supply 11. In this condition, there is no power dissipation in the MPCS 7 anymore, and the MPCS 7 is ready to be cooled down to switch from the open state to the closed state. Cooling the MPCS 7 is done, in part, by controlling the thermal switch 9 to allow the coolant to flow in the loop tube 13 of the convective cooling loop 8, and thus to thermally connect the MPCS 7 to the second stage 5 of the cryocooler 3.

The loop tube 13 may be formed of a non-magnetic metal, such as copper, aluminum, titanium, zinc, tin or lead, for example, or other non-magnetic material. The loop tube 13 is hermetically sealed, and the coolant contained in the loop tube 13 may be helium gas or helium liquid, for example, for enabling the convective transfer of thermal energy between the MPCS 7 and the heat exchanger 10. Other types of gas and/or liquid coolant may be incorporated.

The thermal switch 9 is configured to open and close the loop tube 13 in order to selectively enable and block flow of the coolant, respectively. When the thermal switch 9 is open, the coolant can flow through the loop tube 13 between the MPCS 7 and the heat exchanger 10 in order to dissipate the heat being generated. When the thermal switch 9 is closed, the flow of the coolant through the loop tube 13 is blocked.

According to preferred embodiments of the invention further described below with reference to FIGS. 2 to 7, the thermal switch 9 comprises a valve 14 integrated with the loop tube 13 between the magnetic persistent current switch 7 and the heat exchanger 10. The valves 14 of the different preferred embodiments of the invention each comprise a valve body 15 with and inlet 16 and an outlet 17 with which the valve body 15 is connected to the loop tube 13, a movable shaft 18 which is arranged inside the valve body 15 and which comprises a permanent rod magnet 19, a latching arrangement 20 which comprises a permanent magnet 21, and a solenoid 22. The shaft 18 is movable between a closed position in which the shaft 18 effects the closing of the inlet 16 or the outlet 17 of the valve body 15 and therefore no flow of coolant through the valve body is allowed, and an open position in which the inlet 16 and the outlet 17 of the valve body 15 are open and therefore flow of coolant through the valve body 15 is allowed. Further, the solenoid 22 is arranged relative to the shaft 18 in such a way that by applying a current pulse with a first polarity to the solenoid 22 the shaft 18 is moved to the closed position, and by applying a current pulse with a second polarity to the solenoid 22, the second polarity being opposite to the first polarity, the shaft 18 is moved to the open position. Such a current pulse is initiated by the controller 12 which is connected to the thermal switch by a control line which is depicted in FIG. 1 by a dotted line. The latching arrangement 20 is arranged relative to the shaft 18 in such a way that the magnetic force acting from the permanent magnet 21 of the latching arrangement 20 to the permanent magnet 19 of the shaft 18 forces the shaft 18 to stay in the closed position or in the open position, respectively, as long as no current pulse is applied to the solenoid 22 for switching the shaft 18 from the closed position to the open position or vice versa, respectively. In this way, the latching arrangement ensures that the open state or the closed state of the valve 14, respectively, is maintained in a stable way as long as no active switching by the controller 12 from the open state to the closed state or vice versa occurs.

As depicted in FIGS. 2 to 5, the shaft 18 in one of its two end regions comprises a sealing element 24 which effects the sealing of the inlet 16 or the outlet 17 in the closed position by pressing against a valve seat 23 arranged at the outlet 17. The sealing element 24 is a sealing ball with an inner bore with which it is movably arranged on the shaft 18. According to the embodiments shown in FIGS. 2 to 5, the shaft 18 is arranged within the valve body 15 in such a way that it is rotatable along a rotation axis which is perpendicular to the longitudinal axis of the shaft 18, wherein the longitudinal axis of the shaft 18 is the axis of longest elongation of the shaft. Further, the valve body 15 comprises a groove 25 for guiding the sealing element 24 during the rotation of the shaft 18. On the other side, the shaft 18 comprises a balancing ball 26 which has an inner bore with which it is also movably arranged on the shaft 18. The balancing ball 26 runs in a separate groove 33.

According to the embodiments shown in FIGS. 2 to 5, the rotation range of the shaft 18 is limited to a little less than 90°. The permanent magnet 21 of the latching arrangement 20 is a permanent rod magnet, which is arranged in such a way that one of its ends is directed to the middle region of the rotation range, wherein the polarity of this end is the same as the polarity of the shaft's 18 permanent rod magnet 19 in this rotation range. In this way, the shaft 18, due to repulsive magnetic forces between the same polarities, is either forced in the position which relates to the open state or in the position which relates to the closed state. A switching from the open state to the closed state or vice versa may only be achieved by applying a current pulse with a respective polarity to the solenoid 22 in order to effect a respective pulling or repulsive magnetic force to the shaft 18, respectively.

Figure 2:
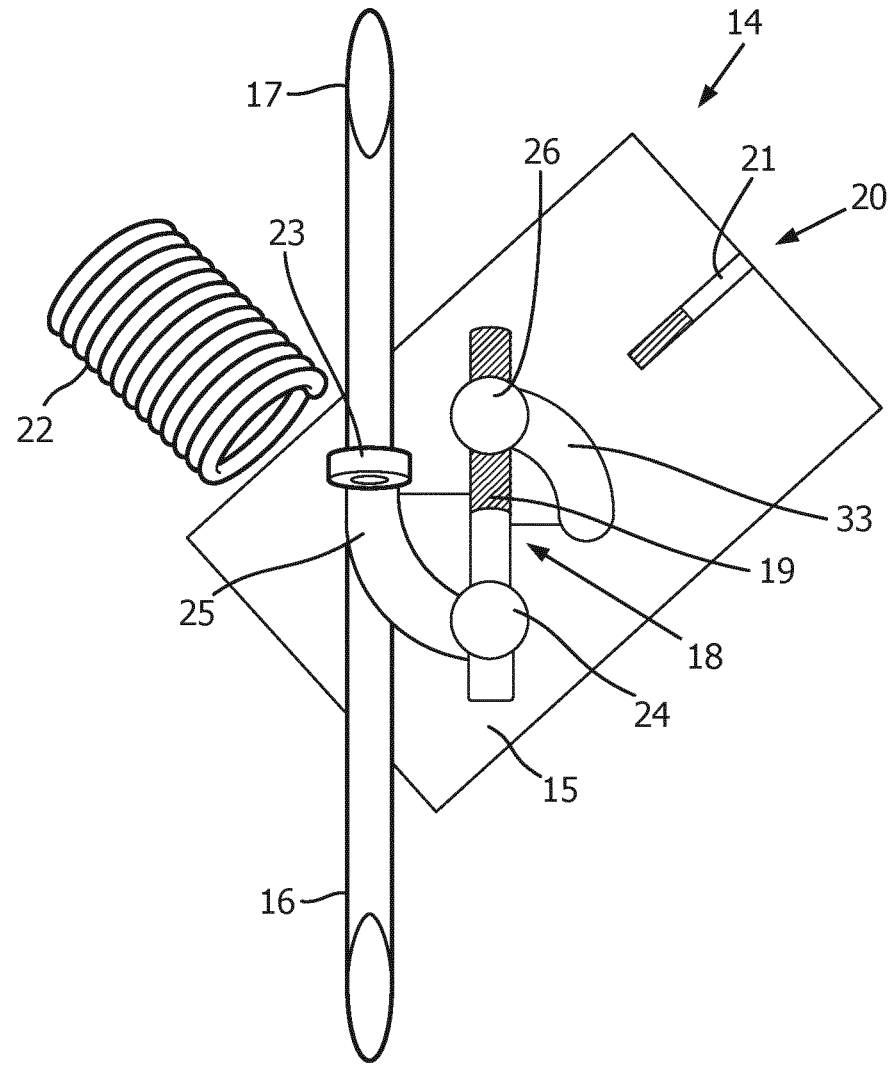
Figure 3:
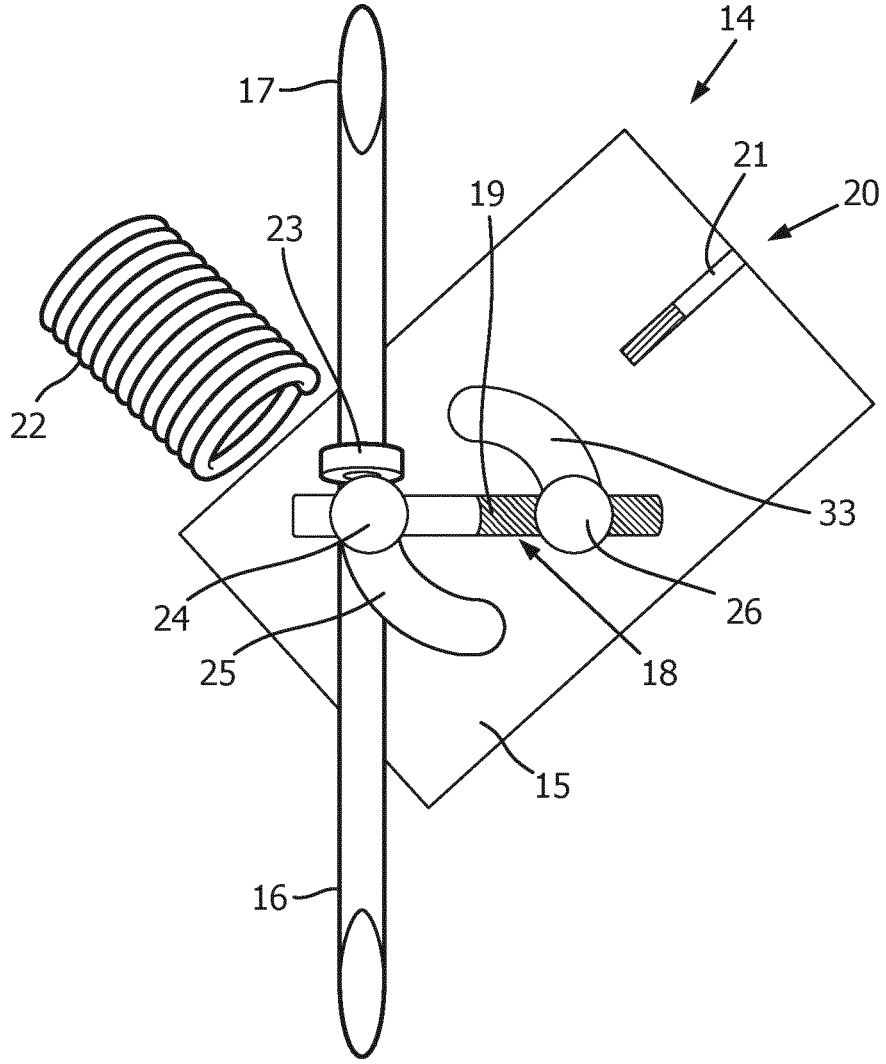
Figure 4:
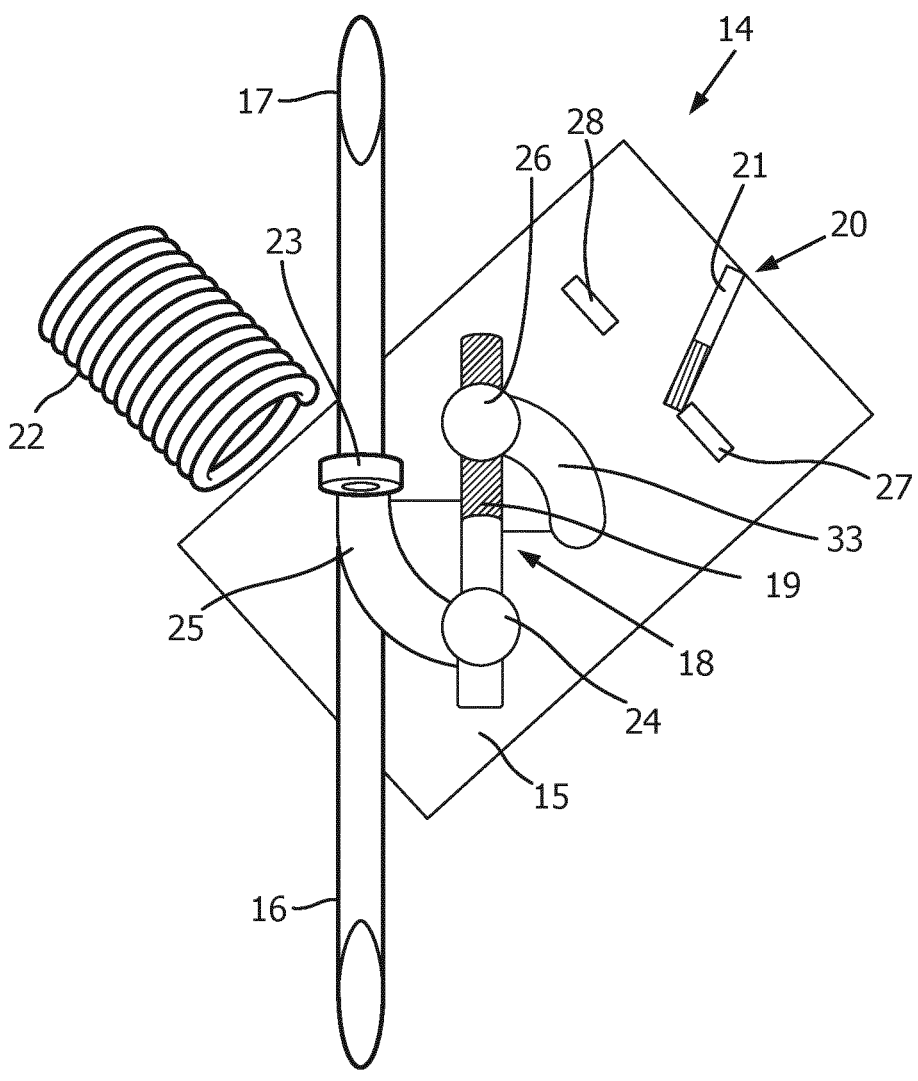
Figure 5:
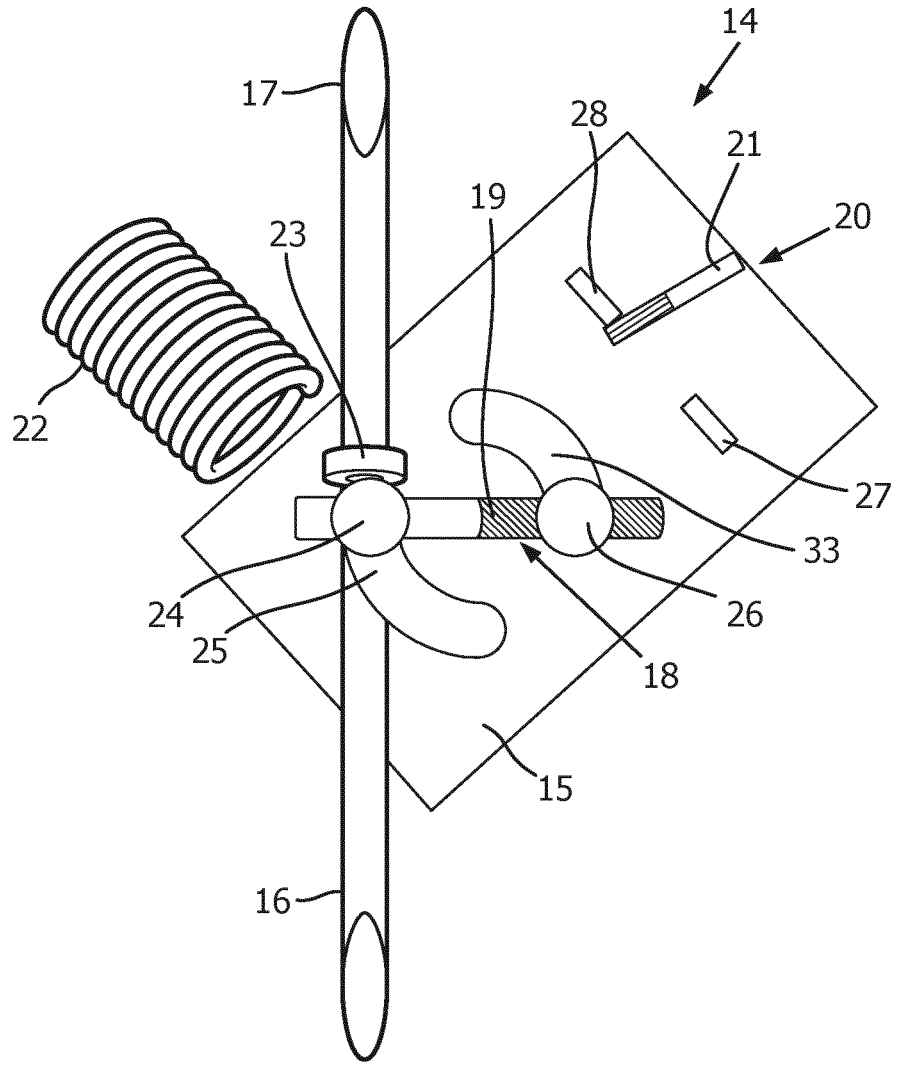

According to the embodiment shown in FIGS. 2 and 3, the permanent magnet 21 of the latching arrangement 20 is fixed and only serves for the purpose of maintaining the open state or the closed state, respectively, as long as no current is applied to the solenoid 22. In contrast to that, according to the embodiment which is shown in FIGS. 4 and 5, the permanent magnet 21 of the latching arrangement 20 is pivotally fixed to the valve body. 15. In this respect, the permanent magnet 21 of the latching arrangement 20 is pivotably arranged in such a way that its end which is directed to the rotation range is pivoted away from the closing position when the shaft 18 is moved to the closing position and pivoted away from the open position when the shaft 18 is moved to the open position. Further, two switching contacts 27, 28 are provided in such a way that one of these switching contacts 27, 28 may be activated by the permanent rod magnet 21 of the latching arrangement by pivoting away from permanent rod magnet 21 in a first direction in order to indicate the closed state of the valve 14, and the other one may be activated by the permanent rod magnet 21 of the latching arrangement 20 by pivoting away from the permanent rod magnet 21 in a second direction which is opposite to the first direction in order to indicate the open state of the valve 14. By contacting the one or the other switching contact 27, 28, a current flow may by initiated via the permanent magnet 21 and the respective switching contact 27, 28 which provides for the possibility of indicating the state of the valve 14. i.e. its closed or open state, respectively.

Figure 6:
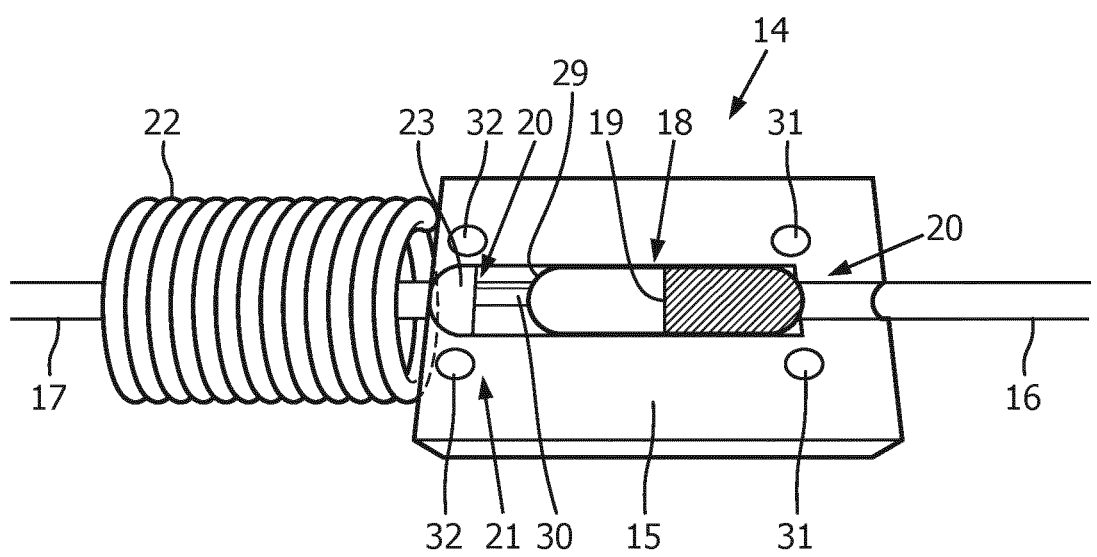
Figure 7:
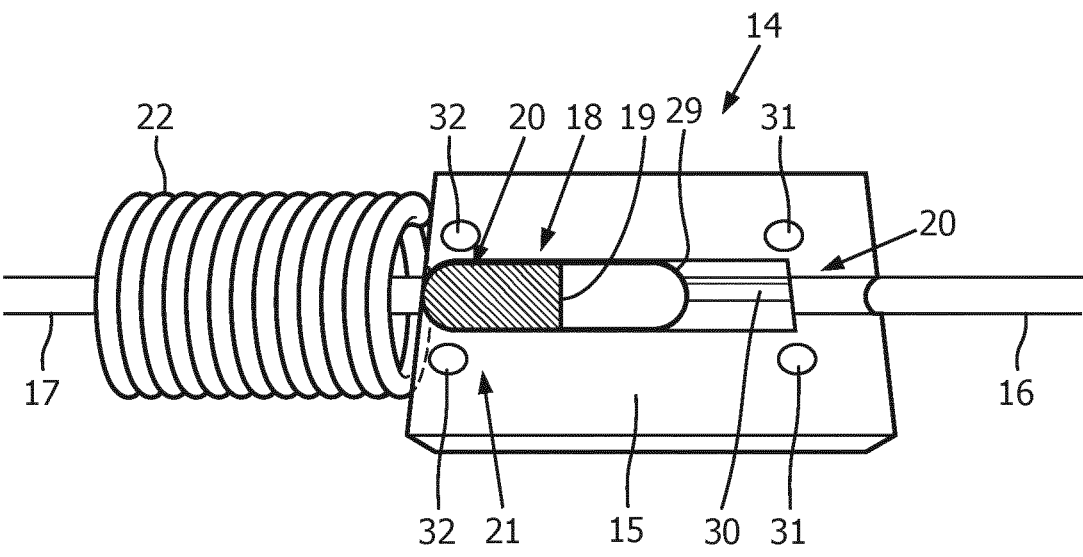

FIGS. 6 and 7 show another embodiment of the invention wherein the shaft 18 is arranged within the valve body 15 in such a way that it is linearly movable along a shaft channel 29 which is provided in the valve body 15. The general working principle of this valve 14 which is shown in its open state in FIG. 6 and in its closed state in FIG. 7 is very similar to the working principle of the valves of FIGS. 2 to 5. With the aid of a current pulse applied to the solenoid 22 the permanent rod magnet 19 of shaft 18 may be moved towards or away from the solenoid 22, depending on the polarity of the current pulse. In this way, the left end of the permanent rod magnet 19 of the shaft may be moved into or away from a valve seat 23 which closes or opens the valve 14, respectively. Here, instead of using a separate sealing element, the permanent rod magnet 19 of shaft 18 itself effects the sealing of the outlet 17 in the closed position by pressing against the valve seat 23 arranged at the outlet. According to this embodiment of the invention, the valve body 15 comprises a flow channel 30 which runs parallel to the shaft channel 29 from the inlet 16 to the outlet 17, wherein the shaft 18 is arranged in such a way inside the valve body 15 that the flow channel 30 is open in the open position for allowing the coolant to flow through the valve body 15 from the inlet 16 to the outlet 17. Further, this embodiment also comprises latching arrangements 20 for maintaining the open or closed state of the valve 14, respectively, as long as no current pulse is applied to the solenoid 22 for changing from the open to the closes state, or vice versa. For achieving this latching arrangement 22, a first permanent magnet 31 is arranged at one end region of the shaft channel 29 and a second permanent magnet 32 is arranged at the other end region of the shaft channel 29, wherein the polarity of the first permanent magnet 31 and the polarity of the end of the permanent rod magnet 19 of the shaft 18 which is facing to the first permanent magnet 31 are opposite to each other, and wherein the polarity of the second permanent magnet 32 and the polarity of the end of the permanent rod magnet 19 of the shaft 18 which is facing to the second permanent magnet 32 are opposite to each other. In this way, the permanent rod magnet 19 of the shaft 18 will stay in the open or closed state of the valve 14, respectively, due to the magnetic forces between the first permanent magnets 31 on the right side or the second permanent magnets 32 on the right side, respectively, and the respective end of the permanent rod magnet 19 of the shaft. Alternatively the latching arrangement includes sets of ferrous or paramagnetic holding elements positioned at the respective end regions of the shaft channel.

While the invention has been illustrated and described in detail in the drawings and foregoing description, such illustration and description are to be considered illustrative or exemplary and not restrictive: the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST superconducting magnet system 1
cryostat 2
cryocooler 3
first stage of the cryocooler 4
second stage of the cryocooler 5
superconducting coil 6
magnetic persistent current switch 7
cooling loop 8
thermal switch 9
first heat exchanger 10
power supply 11
controller 12
loop tube 13
valve 14
valve body 15
inlet 16

12 outlet 17
shaft 18
permanent rod magnet of the shaft 19
latching arrangement 20
permanent magnet of the latching arrangement 21
solenoid 22
valve seat 23
sealing element 24
groove 25
balancing ball 26
contact for open state 27
contact for closed state 28
shaft channel 29
flow channel 30
first permanent magnet 31
second permanent magnet 32
groove 33
second heat exchanger 34

The invention claimed is:

1. A system for controlling a superconducting coil comprising:
a magnetic persistent current switch configured to switch the superconducting coil between a persistent mode and a ramp mode, respectively,
a heat exchanger configured to disperse heat to a cryocooler,
a loop tube configured to enable flow of coolant to transfer thermal energy generated by the magnetic persistent current switch to the heat exchanger, and
a thermal switch comprising a valve integrated with the loop tube between the magnetic persistent current switch and the heat exchanger, the valve comprising
a valve body with and inlet and an outlet with which the valve body is connected to the loop tube,
a movable shaft which is arranged inside the valve body and which comprises a permanent rod magnet,
a latching arrangement which comprises a permanent magnet or a ferrous or paramagnetic holding element, and
a solenoid, wherein
the shaft is movable between a closed position in which the shaft effects the closing of the inlet or the outlet of the valve body and therefore no flow of coolant through the valve body is allowed, and an open position in which the inlet and the outlet of the valve body are open and therefore flow of coolant through the valve body is allowed,
the solenoid is arranged relative to the shaft in such a way that by applying a current pulse with a first polarity to the solenoid the shaft is moved to the closed position, and by applying a current pulse with a second polarity to the solenoid, the second polarity being opposite to the first polarity, the shaft is moved to the open position, and
the latching arrangement is arranged relative to the shaft in such a way that a magnetic force acting from the permanent magnet or the ferrous or paramagnetic holding element of the latching arrangement to the permanent magnet of the shaft forces the shaft to stay in a stable resting position formed by the closed position and the magnetic force forces the shaft to stay in a stable resting position formed by the open position, respectively, as long as no current pulse is applied to the solenoid for switching the shaft from the closed position to the open position or vice versa, respectively.

2. The system for controlling a superconducting coil according to claim 1, wherein the shaft in one of its two end regions comprises a sealing element which effects the sealing of the inlet or the outlet in the closed position by pressing against a valve seat arranged at the inlet or the outlet, respectively.

3. The system for controlling a superconducting coil according to claim 1 wherein the shaft is arranged within the valve body in such a way that it is linearly movable along a shaft channel which is provided in the valve body.

4. A system for controlling a superconducting coil, comprising a magnetic persistent current switch for switching the superconducting coil between a persistent mode and a ramp mode, respectively, a heat exchanger configured to disperse heat to a cryocooler, a loop tube configured to enable flow of coolant to transfer thermal energy generated by the magnetic persistent current switch to the heat exchanger, and a thermal switch comprising a valve integrated with the loop tube between the magnetic persistent current switch and the heat exchanger, the valve comprising a valve body with and inlet and an outlet with which the valve body is connected to the loop tube, a movable shaft which is arranged inside the valve body and which comprises a permanent rod magnet, a latching arrangement arranged relative to the shaft in such a way that a magnetic force acting from the permanent magnet or a ferrous or paramagnetic holding element of the latching arrangement to the permanent magnet of the shaft forces the shaft to stay in a stable resting position formed by the closed position or in the open position, respectively, as long as no current pulse is applied to the solenoid for switching the shaft from the closed position to the open position or vice versa, respectively, and a solenoid, wherein the shaft is movable between a closed position in which the shaft effects the closing of the inlet or the outlet of the valve body and therefore no flow of coolant through the valve body is allowed, and an open position in which the inlet and the outlet of the valve body are open and therefore flow of coolant through the valve body is allowed; and the solenoid is arranged relative to the shaft in such a way that by applying a current pulse with a first polarity to the solenoid the shaft is moved to the closed position, and by applying a current pulse with a second polarity to the solenoid, the second polarity being opposite to the first polarity, the shaft is moved to the open position, wherein the shaft is arranged within the valve body in such a way that it is rotatable along a rotation axis which is perpendicular to the longitudinal axis of the shaft.

5. The system for controlling a superconducting coil according to claim 4, wherein the rotation range of the shaft is limited to less than 90°, the permanent magnet of the latching arrangement is a permanent rod magnet, and the permanent magnet of the latching arrangement is arranged such that one of its ends is directed to the middle region of the rotation range, the polarity of this end being the same as the polarity of the shaft's permanent rod magnet in this rotation range.

6. The system for controlling a superconducting coil according to claim 4, wherein the permanent magnet of the latching arrangement is pivotably arranged in such a way that its end which is directed to the rotation range is pivoted away from the shaft in a first direction when the shaft is moved to the closing position and pivoted from away from the shaft in a second direction which is opposite to the first direction when the shaft is moved to the open position.

7. A method for operating a system for controlling a superconducting coil, the system comprising a magnetic persistent current switch, a heat exchanger configured to disperse heat to a cryocooler, a loop tube connecting the magnetic persistent current switch to the heat exchanger, and a thermal switch comprising a valve integrated with the loop tube between the magnetic persistent current switch and the heat exchanger, the valve comprising a valve body with and inlet and an outlet with which the valve body is connected to the loop tube, a movable shaft which is arranged inside the valve body and which comprises a permanent rod magnet, a latching arrangement which comprises a permanent magnet or a ferrous or paramagnetic holding element, and a solenoid, wherein the method comprises the following method steps:

switching the superconducting coil between a persistent mode and a ramp mode, respectively, dispersing heat from the heat exchanger to the cryocooler, enabling flow of coolant to transfer thermal energy generated by the magnetic persistent current switch to the heat exchanger, moving the shaft between a closed position in which the shaft effects the closing of the inlet or the outlet of the valve body and therefore no flow of coolant through the valve body is allowed, and an open position in which the inlet and the outlet of the valve body are open and therefore flow of coolant through the valve body is allowed, applying a current pulse with a first polarity to the solenoid such that the shaft is moved to the closed position, or applying a current pulse with a second polarity to the solenoid, the second polarity being opposite to the first polarity, so that the shaft is moved to the open position, and letting a magnetic force from the permanent magnet of the latching arrangement act to the permanent magnet of the shaft to force the shaft to stay in the closed position and letting the magnetic force force the shaft to stay in the open position, respectively, as long as no current pulse is applied to the solenoid for switching the shaft from the closed position to the open position or vice versa, respectively.

8. A non-transitory computer-readable medium, comprising instructions stored thereon, that when executed on a processor induce a system for controlling a superconducting coil to perform the method of claim 7.

9. A system for controlling a superconducting coil comprising:

a magnetic persistent current switch configured to switch the superconducting coil between a persistent mode and a ramp mode, respectively;

a heat exchanger configured to disperse heat to a cryocooler;

a loop tube configured to enable flow of coolant to transfer thermal energy generated by the magnetic persistent current switch to the heat exchanger; and a thermal switch comprising a valve integrated with the loop tube between the magnetic persistent current switch and the heat exchanger, the valve comprising:

a valve body with and inlet and an outlet with which the valve body is connected to the loop tube, the valve body comprising a flow channel which runs parallel to a shaft channel from the inlet to the outlet;

a movable shaft which is arranged inside the valve body and which comprises a permanent rod magnet;

a latching arrangement which comprises a permanent magnet or a ferrous or paramagnetic holding element; and a solenoid, wherein: the shaft is movable between a closed position in which the shaft effects the closing of the inlet or the outlet of the valve body and therefore no flow of coolant through the valve body is allowed, and an open position in which the inlet and the outlet of the valve body are open and therefore flow of coolant through the valve body is allowed; the shaft is arranged within the valve body in such a way that it is linearly movable along the shaft channel which is provided in the valve body; the shaft is arranged in such a way inside the valve body that the flow channel is open in the open position for allowing the coolant to flow through the valve body from the inlet to the outlet; the solenoid is arranged relative to the shaft in such a way that by applying a current pulse with a first polarity to the solenoid the shaft is moved to the closed position, and by applying a current pulse with a second polarity to the solenoid, the second polarity being opposite to the first polarity, the shaft is moved to the open position; and the latching arrangement is arranged relative to the shaft in such a way that a magnetic force acting from the permanent magnet or the ferrous or paramagnetic holding element of the latching arrangement to the permanent magnet of the shaft forces the shaft to stay in a stable resting position formed by the closed position as well as in the open position, respectively, as long as no current pulse is applied to the solenoid for switching the shaft from the closed position to the open position or vice versa, respectively.

10. The system for controlling a superconducting coil according to claim 9, wherein the shaft in one of its two end regions comprises a sealing element which effects the sealing of the inlet or the outlet in the closed position by pressing against a valve seat arranged at the inlet or the outlet, respectively.

\* \* \* \* \*